United States Patent
Ambrogio et al.

(10) Patent No.: US 11,514,981 B1
(45) Date of Patent: Nov. 29, 2022

(54) PROGRAMMING DEVICES AND WEIGHTS IN HARDWARE

(71) Applicant: International Business Machines Corporation, Armonk, NY (US)

(72) Inventors: Stefano Ambrogio, San Jose, CA (US); Pritish Narayanan, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 47 days.

(21) Appl. No.: 17/339,046

(22) Filed: Jun. 4, 2021

(51) Int. Cl.
  G11C 16/04 (2006.01)
  G11C 11/54 (2006.01)
  G06F 3/06 (2006.01)
  G11C 13/00 (2006.01)

(52) U.S. Cl.
  CPC .......... G11C 11/54 (2013.01); G06F 3/0604 (2013.01); G06F 3/0659 (2013.01); G06F 3/0679 (2013.01); G11C 13/0004 (2013.01); G11C 13/0069 (2013.01); G11C 2013/0092 (2013.01); G11C 2213/79 (2013.01)

(58) Field of Classification Search
  CPC . G11C 11/54; G11C 13/0004; G11C 13/0069; G11C 2013/0092; G11C 2213/79
  See application file for complete search history.

(56) References Cited

U.S. PATENT DOCUMENTS

| | | | |
|---|---|---|---|
| 9,070,481 B1* | 6/2015 | Ellis | G06F 11/3058 |
| 10,719,243 B2* | 7/2020 | Radhakrishnan | G06F 12/0246 |
| 10,909,449 B2 | 2/2021 | Obradovic et al. | |
| 2012/0110250 A1* | 5/2012 | Sabbag | G06F 11/1072 |
| | | | 711/E12.008 |
| 2018/0300618 A1 | 10/2018 | Obradovic et al. | |
| 2020/0050928 A1 | 2/2020 | Narayanan et al. | |
| 2020/0319808 A1 | 10/2020 | Wang et al. | |
| 2020/0372335 A1 | 11/2020 | Ambrogio et al. | |

OTHER PUBLICATIONS

Chakraborty et al., "Unified Characterization Platform for Emerging NVM Technology: Neural Network Application Benchmarking Using off-the-shelf NVM Chips", Accepted as conference paper at the IEEE International Symposium an Circuits and Systems (ISCAS) 2020, Jun. 10, 2020, 5 pages.

(Continued)

*Primary Examiner* — Pho M Luu
(74) *Attorney, Agent, or Firm* — Donald J. O'Brien

(57) ABSTRACT

The method includes setting conductances for corresponding non-volatile memory (NVM) devices of a cross-bar array to zero. The method further includes determining a plurality of pulse-widths for the corresponding plurality of NVM devices based on a corresponding plurality of programming errors. Additionally, the method includes programming the NVM devices using the determined pulse-widths. Also, the method includes measuring actual conductances for the corresponding NVM devices. Further, the method includes adjusting scaling factors for the corresponding NVM devices based on the actual conductances and the corresponding programming errors. Additionally, the method includes programming the corresponding NVM devices based on the determined pulse-widths and the scaling factors.

20 Claims, 4 Drawing Sheets

(56) References Cited

OTHER PUBLICATIONS

Anonymous, "Programming and readout circuit allocation in multi-level phase-change memory array", An IP.com Prior Art Database Technical Disclosure, IP.com No. IPCOM000239473D, IP.com Electronic Publication Date Nov. 11, 2014, 11 pages.

Van Dijk, L., "Central Non Volatile Memory for Data and/or Program Memory Storage", An IP.com Prior Art Database Technical Disclosure, IP.com No. IPCOM000226238D, IP.com Electronic Publication Date: Mar. 25, 2013, 6 pages.

Anonymous, "Design of neural networks based on cost estimation", An IP.com Prior Art Database Technical Disclosure, IP.com No. IPCOM000257359D, IP.com Electronic Publication Date: Feb. 5, 2019, 11 pages.

\* cited by examiner

US 11,514,981 B1

PROGRAMMING DEVICES AND WEIGHTS IN HARDWARE

BACKGROUND

The present disclosure relates to programming, and more specifically, to programming devices and weights in hardware.

Neural networks are machine learning tools that are loosely inspired by biological neural networks. The neurons of a neural network can be computer hardware devices that act as parallel processing units interconnected by synthetic synapses. By tuning weights of the interconnections, the neural network can solve certain classification problems, such as image and voice recognition.

SUMMARY

Embodiments are disclosed for a method. The method includes setting conductances for corresponding non-volatile memory (NVM) devices of a cross-bar array to zero. The method further includes determining a plurality of pulse-widths for the corresponding plurality of NVM devices based on a corresponding plurality of programming errors. Additionally, the method includes programming the NVM devices using the determined pulse-widths. Also, the method includes measuring actual conductances for the corresponding NVM devices. Further, the method includes adjusting scaling factors for the corresponding NVM devices based on the actual conductances and the corresponding programming errors. Additionally, the method includes programming the corresponding NVM devices based on the determined pulse-widths and the scaling factors.

Further aspects of the present disclosure are directed toward systems and computer program products with functionality similar to the functionality discussed above regarding the computer-implemented methods. The present summary is not intended to illustrate each aspect of, every implementation of, and/or every embodiment of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
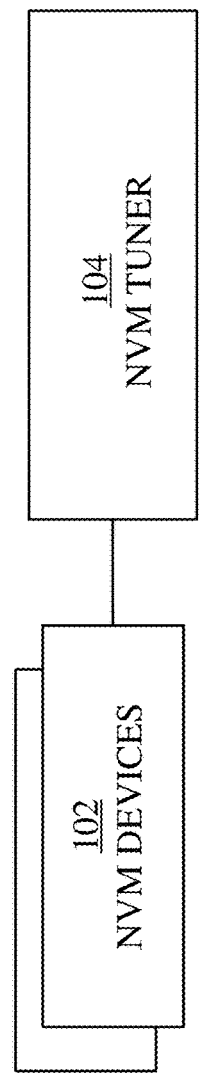
FIG. 1 is a block diagram of an example system for programming devices and weights in hardware, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the embodiments described. On the contrary, the intention is to cover all modifications, equivalents, and alternatives falling within the spirit and scope of the present disclosure.

DETAILED DESCRIPTION

As stated previously, neural networks can be encoded in hardware chips that perform neural network inference at relatively high speed and low power. Further, neural networks can be encoded in hardware chips that perform neural network inference at relatively high speed and low power. Such inference chips can use relatively large matrices of non-volatile memory (NVM) devices, such as, phase-change memory (PCM) or resistive memory (RRAM), to encode these weights. These matrices are also referred to herein as cross-bar arrays. In some designs, multiple devices are assigned to each weight, with a variable distribution of the programmed weight W over various memory devices, where the weight can be determined by summing the various conductances and applying a scaling factor, F. Conductances are the electrical charges that the memory devices hold to encode the weights.

In inference chips, cross-bar arrays can be useful for performing matrix multiply and accumulator operations, which can calculate sums of W multiplied by an input, x. These sums are equal to the current value of each row, which is equal to the voltage multiplied by the conductance. The x value is determined by the pulse-width. The pulse-width is the duration of the electrical pulse. While the pulse-width varies based on the x value, the amplitude of this pulse is constant. Accordingly, pulses of longer widths correspond to larger values of x. Further, these voltage pulses are applied on a conductance, which will generate a current. Further, multiple pulses of multiple durations are sent over multiple rows at the same time, and can be summed in a peripheral capacitor. This summation can serve as the basis of inference in a neural network.

However, in some neural networks, the number of weights involved can reach into the billions. As such, programming the conductances of the NVM devices used to store these weights can take relatively long periods of time, which can be costly and reduce the efficiency of the neural network.

Accordingly, some embodiments of the present disclosure can provide a row-wise programming of the conductances in memory device matrices in parallel, with a self-quenching effect. More specifically, some embodiments of the present disclosure can use the error in the programming of conductances to tune the pulse-width of the programming pulse in each column of the programmed row. In this way, some embodiments of the present disclosure can provide relatively fast and accurate closed-loop tuning (CLT) of conductances of matrices of multibit memory devices. Closed loop tuning refers to the process of encoding, or programming, the values of weights into memory devices. Further, some embodiments of the present disclosure can provide relatively fast and accurate CLT of matrices of memory devices in inference chips, thus enabling reliable inference chips and ensuring accurate model updates for machine learning models that use such inference chips.

FIG. 1 is a block diagram of an example system 100 for programming devices and weights in hardware, in accordance with some embodiments of the present disclosure. The system 100 includes non-volatile memory (NVM) devices 102 and NVM tuner 104. The NVM devices 102 are memory devices that can retain stored data after the removal of power. Some examples of NVM devices 102 can include phase change memory (PCM) and resistive random access memory (RRAM). In some embodiments, the NVM devices 102 are arranged in cross-bar arrays, such as, used in neural network inference and training. In some embodiments of the present disclosure, the NVM devices 102 are incorporated into a hardware chip (not shown), such as a hardware accelerator used for machine learning and artificial intelligence.

The NVM tuner 104 can be configured to program, in parallel, the NVM devices 102 with target conductances in a row-wise manner. As stated previously, programming conductance in an NVM device 102 can involve providing a current of a predetermined pulse-width to the NVM device 102. The target conductance is referred to herein as $G_{target}$. However, the conductance stored, $G_{actual}$, may not match the target, leaving some amount of error, e.g., $G_{error}$, where $G_{error}=G_{target}-G_{actual}$. Accordingly, the NVM tuner 104 can measure the amount of error in each NVM device 102 in a row, and send additional pulses of current having pulse-widths proportional to the amount of the error in each NVM device 102. Thus, as the error becomes smaller, the additional pulses of current have smaller pulse-widths. The NVM tuner 104 can thus stop further programming when the error approaches zero. In this way, the NVM tuner 104 may self-quench further programming of the NVM devices 102 once the NVM devices 102 reach the correct values.

Additionally, the NVM tuner 104 can use a tuning factor, $\alpha$, for each NVM device 102 that is responsive to the sensitivity of the particular NVM device 102. Thus, the tuning factor, $\alpha$, can be a constant of proportionality between the error and the target. In some embodiments of the present disclosure, the NVM tuner 104 can tune this $\alpha$ to help converge the programming of each NVM device 102. For example, if the error is still relatively large after a first programming attempt, the NVM tuner 104 can increase $\alpha$ to make further programming pulse-widths more sensitive to the error. Thus, if an NVM device 102 is relatively less sensitive to programming, the NVM tuner 104 can increase the $\alpha$ for stronger programming, i.e., making pulse-widths longer. In contrast, if the NVM device 102 is relatively more sensitive to programming, i.e., the NVM device 102 reacts strongly to relatively small pulse-widths, the NVM tuner 104 can reduce the $\alpha$ in order to provide the NVM device 102 smaller pulse-widths. In this way, the NVM tuner 104 can provide relatively faster convergence over the full dynamic range. The full dynamic range refers to the fact that accurately programming some NVM devices 102 involves programming at relatively small pulse-widths. Additionally, accurately programming other NVM devices 102 involves programming at relatively large pulse-widths. Thus, every NVM device 102 can have a different target, from relatively small to relatively large. Further, by using this $\alpha$, the NVM tuner 104 can reduce outliers (NVM devices 102 that are challenging to program using current techniques).

Figure 2:
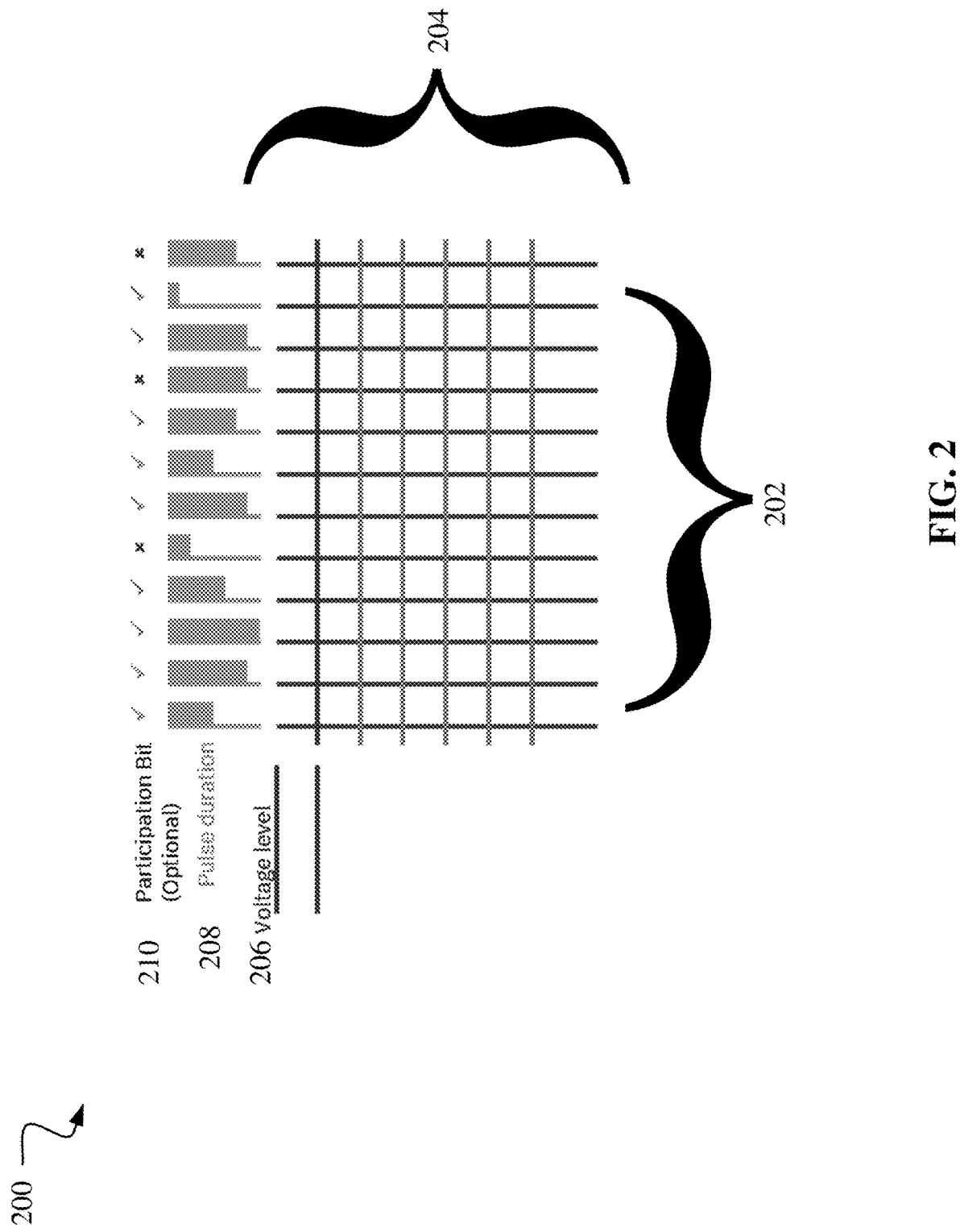
FIG. 2 is a block diagram of an example cross-bar array of non-volatile memory devices, in accordance with some embodiments of the present disclosure.

FIG. 2 is a block diagram of a cross-bar array 200 of NVM devices, in accordance with some embodiments of the present disclosure. The cross-bar array 200 includes rows 202 and columns 204 of NVM devices, such as the NVM devices 102, described with respect to FIG. 1. The intersection of each line, representing the rows 202 and columns 204 represents one NVM device 102. In some embodiments of the present disclosure, the NVM tuner 104 can apply a certain voltage level 206 to all the NVM devices 102 in a row 202. The voltage level 206 can control the amount of current that can flow through each column 204. Additionally, the NVM tuner 104 can apply pulse durations 208. As stated previously, the NVM tuner 104 can program a row 202 of NVM devices 102 by providing a current having a pulse-width 208 that is proportional to the error, e.g., $G_{error}$, of each NVM device 102 in the row 202. Further, in some embodiments of the present disclosure, the cross-bar array 200 can include a participation bit 210 for each column 204. When the participation bit 210 is set, the cross-bar array 200 allows the current to flow along the respective column 204. When the participation bit 210 is not set, the cross-bar array 200 may not allow the current to flow, thus preventing devices already correctly programmed to be further changed. Accordingly, the NVM tuner 104 can set the participation bit 210 when the respective NVM device 102 has reached the $G_{target}$. Removing the NVM device 102 from programming in this way can help avoid disturbances from read noise.

Figure 3:
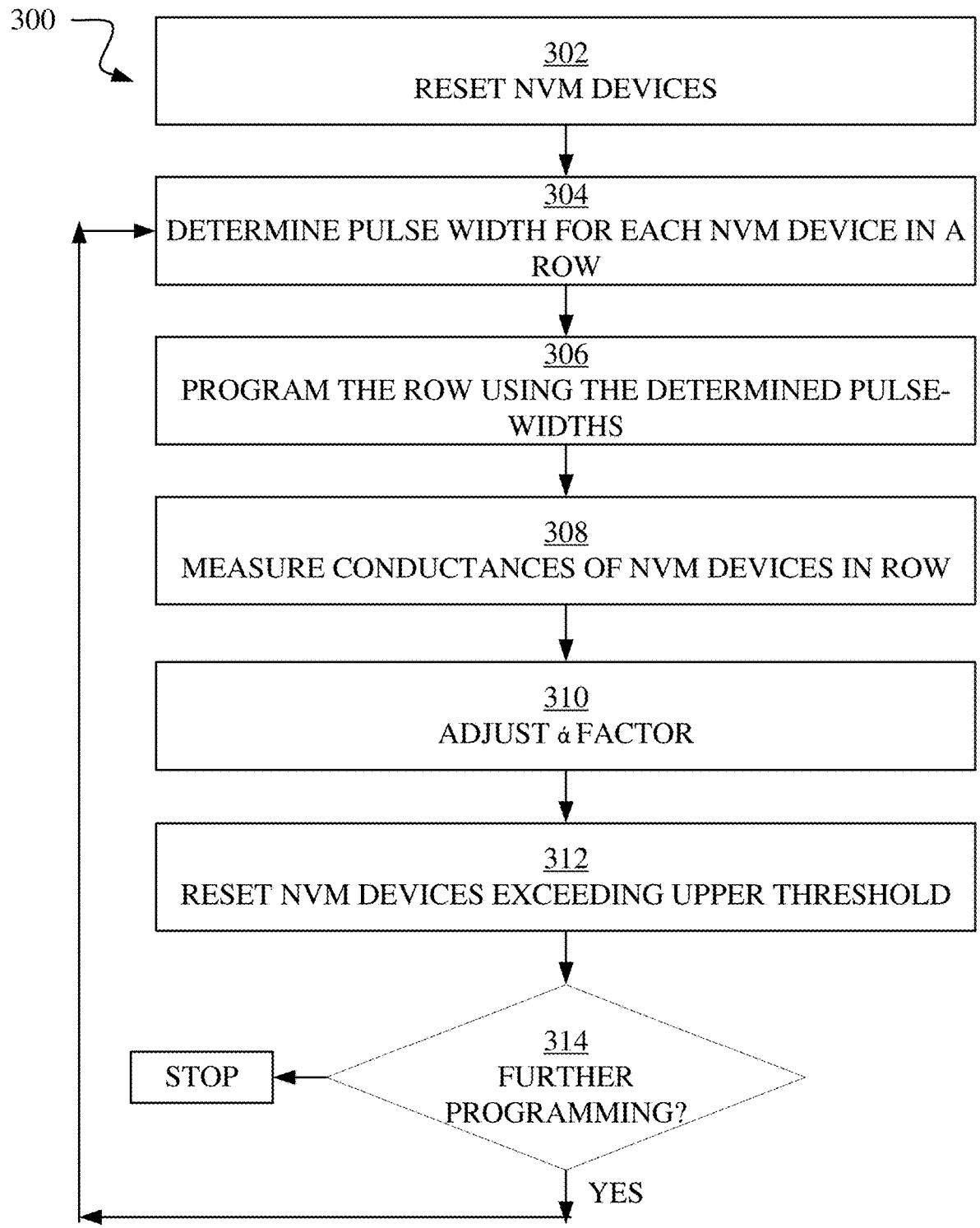
FIG. 3 is a process flow chart of a method for programming devices and weights in hardware, in accordance with some embodiments of the present disclosure.

FIG. 3 is a process flow chart of a method 300 for programming devices and weights in hardware, in accordance with some embodiments of the present disclosure. In some embodiments, an NVM tuner, such as the NVM tuner 104, can perform the method 300 for each row of NVM devices, such as the NVM devices 102.

At operation 302, the NVM tuner 104 can reset the NVM devices 102. Resetting the NVM devices 102 can involve setting the conductance, e.g., the value stored, in each NVM device 102 to zero.

The NVM tuner 104 can perform operations 304 through 306 a predetermined number of times (iterations) using linearly decreasing currents. Thus, in a first iteration, the NVM tuner 104 can perform operations 304 through 306 using a square pulse, i.e., a relatively large current. Accordingly, the NVM tuner 104 can reduce the current to zero in a linear manner over the predetermined number of iterations.

At operation 304, the NVM tuner 104 can determine the pulse-width for each NVM device 102 in a row. The pulse-width can be equal to the $\alpha$ factor multiplied by the error, e.g., $G_{error}$. In the first iteration, the $\alpha$ factor can be equal to one. As stated previously, $G_{error}=G_{actual}-G_{target}$. Thus, in the first iteration, because $G_{actual}$ is equal to zero, $G_{error}$ is equal to $G_{target}$.

At operation 306, the NVM tuner 104 can program the row 202 using the determined pulse-widths. Programming the row 202 can involve applying the current with the determined pulse-widths to the respective NVM devices 102.

At operation 308, the NVM tuner 104 can measure the conductances of the NVM devices 102 of the programmed row 202. Each conductance can be equal to $G_{actual}$.

At operation 310, the NVM tuner 104 can adjust the $\alpha$ factor for each of the NVM devices 102. For example, if $G_{actual}$ is greater than an upper threshold ($G_{target}$ plus a predetermined upper margin, $M_{up}$), i.e., $G_{actual}>G_{target}+M_{up}$, the NVM device 102 may be reacting too strongly to the applied current. Thus, the NVM tuner 104 can reduce $\alpha$.

Further, if $G_{actual}$ is less than a lower threshold ($G_{target}$ minus a predetermined lower margin, $M_{low}$), i.e., $G_{actual}<G_{target}-M_{low}$, the NVM device 102 may not be reacting strongly enough to the applied current. Thus, the NVM tuner 104 can increase $\alpha$.

However, if $G_{actual}$ is between the upper and lower thresholds, i.e., $G_{target}-M_{low}<G_{actual}<G_{target}+M_{up}$, the NVM device 102 may be reacting accurately to the applied current. Thus, the NVM tuner 104 may leave $\alpha$ unchanged.

At operation 312, the NVM tuner 104 can reset the NVM devices 102 with conductances exceeding the upper threshold. Because the method 300 merely increases conductances in the programmed NVM devices 102, further increasing conductances of such devices increases the error, $G_{error}$. As such, resetting the conductances of such devices to zero makes it possible for the NVM tuner 104 to accurately program the NVM devices 102 on further iterations of operations 304 through 308.

At operation 314, the NVM tuner 104 can determine whether to perform further programming for the row 202. If the conductances, i.e., $G_{actual}$, of any NVM device 102 is not between the upper and lower thresholds, the method 300 may flow to operation 304. However, if the conductances of all the NVM devices 102 in the row 202 are within the upper and lower thresholds, the method 300 may terminate.

However, if the NVM devices 102 store weights, such as, in a neural network chip, the NVM tuner 104 may program weights instead of conductances. However, because weights can be positive or negative, the neural network may use multiple NVM devices 102 to store individual weights. Using multiple NVM devices 102 to store weights can be useful because weights may be positive or negative values. However, conductances are restricted to zero and positive values. As such, to program a negative weight value in an NVM device 102, the neural network may store two different conductances in two different NVM devices 102. As such, a negative weight value can be represented as the difference between the two conductances, g+ and g−. Thus, if the weight is a positive value, after finalizing G+ programming, successive approximation steps can be employed using G−, g+ and g−. Sometimes, after G+ programming, the NVM device 102 is within upper and lower thresholds, but sometimes this does not happen. In both cases, the NVM tuner 104 can try correcting the weight programmed by using the other 3 conductances. Similarly, if the weight is a negative value, after finalizing G− programming, successive approximation steps can be employed using G+, g+ and g−.

Thus, the NVM tuner 104 can provide a row-wise parallel programming method for both RRAM and PCM devices by leveraging common compliance current and custom pulse-width duration usable in a variety of architectures: to program weights in analog tiles for neural network inference, to update weights in analog tiles for neural network training, and to program multibit memories in crossbar architectures such as 1-Transistor 1-Resistor (1T1R); 1-Selector 1-Resistor (1S1R), and the like. Further, the NVM tuner 104 can determine pulse-width duration based on the difference between actual conductance (or weight) and target conductance (or weight), thus providing a self-quenched programming technique. Additionally, the NVM tuner 104 can use a tunable parameter, α, that enables conductance G control and removal of up/down threshold schemes during a compliance current sweep. Such a tunable parameter controls the trade-off between convergence speed and program error. More specifically, some NVM devices 102 can experience relatively slow conductance, or weight, changes (leading to controllable, but slow, behavior). Accordingly, the NVM tuner 104 can increase α to accelerate the programming. In contrast, other devices can experience relatively large conductance, or weight, changes (fast but difficult to control). Accordingly, the NVM tuner 104 can decrease α to slow the programming speed.

Figure 4:
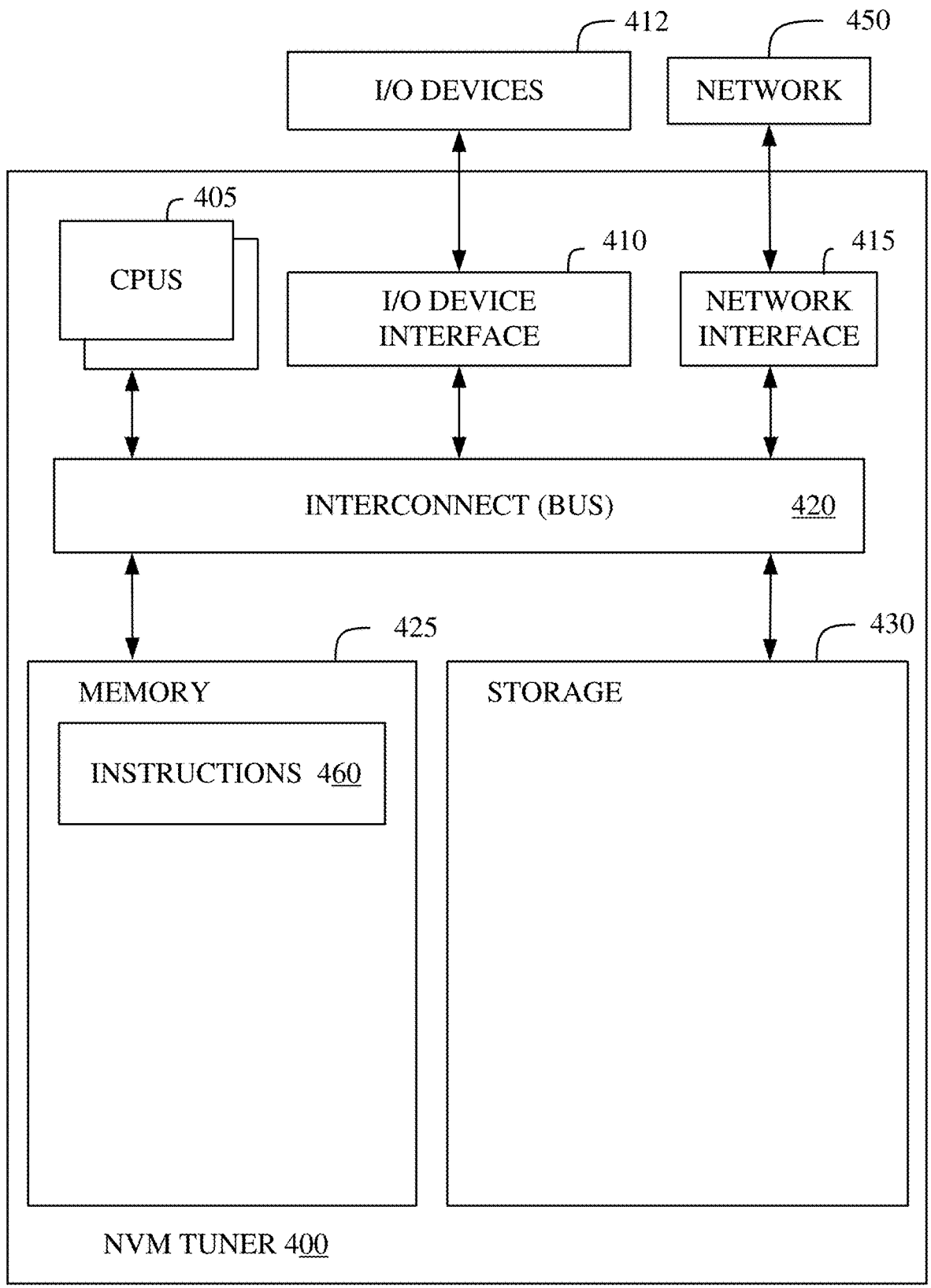
FIG. 4 is a block diagram of an example non-volatile memory (NVM) tuner, in accordance with some embodiments of the present disclosure.

FIG. 4 is a block diagram of an example NVM tuner 400, in accordance with some embodiments of the present disclosure. In various embodiments, the NVM tuner 400 is similar to the NVM tuner 104 and can perform the method described in FIG. 3 and/or the functionality discussed in FIGS. 1 and 2. In some embodiments, the NVM tuner 400 provides instructions for the aforementioned methods and/or functionalities to a client machine such that the client machine executes the method, or a portion of the method, based on the instructions provided by the NVM tuner 400.

In some embodiments, the NVM tuner 400 comprises software executing on hardware incorporated into a plurality of devices.

The NVM tuner 400 includes a memory 425, storage 430, an interconnect (e.g., BUS) 420, one or more CPUs 405 (also referred to as processors 405 herein), an I/O device interface 410, I/O devices 412, and a network interface 415.

Each CPU 405 retrieves and executes programming instructions stored in the memory 425 or the storage 430. The interconnect 420 is used to move data, such as programming instructions, between the CPUs 405, I/O device interface 410, storage 430, network interface 415, and memory 425. The interconnect 420 can be implemented using one or more busses. The CPUs 405 can be a single CPU, multiple CPUs, or a single CPU having multiple processing cores in various embodiments. In some embodiments, a CPU 405 can be a digital signal processor (DSP). In some embodiments, CPU 405 includes one or more 3D integrated circuits (3DICs) (e.g., 3D wafer-level packaging (3DWLP), 3D interposer based integration, 3D stacked ICs (3D-SICs), monolithic 3D ICs, 3D heterogeneous integration, 3D system in package (3DSiP), and/or package on package (PoP) CPU configurations). Memory 425 is generally included to be representative of a random access memory (e.g., static random access memory (SRAM), dynamic random access memory (DRAM), or Flash). The storage 430 is generally included to be representative of a non-volatile memory, such as a hard disk drive, solid state device (SSD), removable memory cards, optical storage, and/or flash memory devices. Additionally, the storage 430 can include storage area-network (SAN) devices, the cloud, or other devices connected to the NVM tuner 400 via the I/O device interface 410 or to a network 450 via the network interface 415.

In some embodiments, the memory 425 stores instructions 460. However, in various embodiments, the instructions 460 are stored partially in memory 425 and partially in storage 430, or they are stored entirely in memory 425 or entirely in storage 430, or they are accessed over a network 450 via the network interface 415.

Instructions 460 can be processor-executable instructions for performing any portion of, or all, any of the method described in FIG. 3 and/or the functionality discussed in FIGS. 1 and 2.

In various embodiments, the I/O devices 412 include an interface capable of presenting information and receiving input. For example, I/O devices 412 can present information to a listener interacting with NVM tuner 400 and receive input from the listener.

The NVM tuner 400 is connected to the network 450 via the network interface 415. Network 450 can comprise a physical, wireless, cellular, or different network.

In some embodiments, the NVM tuner 400 can be a multi-user mainframe computer system, a single-user system, or a server computer or similar device that has little or no direct user interface but receives requests from other computer systems (clients). Further, in some embodiments, the NVM tuner 400 can be implemented as a desktop computer, portable computer, laptop or notebook computer, tablet computer, pocket computer, telephone, smart phone, network switches or routers, or any other appropriate type of electronic device.

It is noted that FIG. 4 is intended to depict the representative major components of an exemplary NVM tuner 400. In some embodiments, however, individual components can have greater or lesser complexity than as represented in FIG. 4, components other than or in addition to those shown in FIG. 4 can be present, and the number, type, and configuration of such components can vary.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A system comprising:
   a computer processing circuit; and a computer-readable storage medium storing instructions, which, when executed by the computer processing circuit, are configured to cause the computer processing circuit to perform a method comprising:
    setting a plurality of conductances for a corresponding plurality of non-volatile memory (NVM) devices of a cross-bar array to zero;
    determining a plurality of pulse-widths for the corresponding plurality of NVM devices based on a corresponding plurality of programming errors;
    programming the corresponding plurality of NVM devices using the determined plurality of pulse-widths;
    measuring a plurality of actual conductances for the corresponding plurality of NVM devices;
    adjusting a plurality of scaling factors for the corresponding plurality of NVM devices based on the plurality of actual conductances and the corresponding plurality of programming errors; and
    programming the corresponding plurality of NVM devices based on the determined plurality of pulse-widths and the plurality of scaling factors.

2. The system of claim 1, wherein an inference chip for a neural network comprises the corresponding plurality of NVM devices.

3. The system of claim 1, wherein the corresponding plurality of NVM devices comprise a phase change memory device.

4. The system of claim 1, wherein the corresponding plurality of NVM devices comprise a resistive random access memory device.

5. The system of claim 1, wherein the corresponding plurality of NVM devices comprise a transistor and a resistor.

6. The system of claim 1, wherein the corresponding plurality of NVM devices comprise a selector and a resistor.

7. The system of claim 1, wherein the plurality of conductances comprise a plurality of weights associated with a plurality of inferences for a neural network.

8. A method comprising:
    setting a plurality of conductances for a corresponding plurality of non-volatile memory (NVM) devices of a cross-bar array to zero;
    determining a plurality of pulse-widths for the corresponding plurality of NVM devices based on a corresponding plurality of programming errors;
    programming the corresponding plurality of NVM devices using the determined plurality of pulse-widths;
    measuring a plurality of actual conductances for the corresponding plurality of NVM devices;
    adjusting a plurality of scaling factors for the corresponding plurality of NVM devices based on the plurality of actual conductances and the corresponding plurality of programming errors; and
    programming the corresponding plurality of NVM devices based on the determined plurality of pulse-widths and the plurality of scaling factors.

9. The method of claim 8, wherein an inference chip for a neural network comprises the corresponding plurality of NVM devices.

10. The method of claim 8, wherein the corresponding plurality of NVM devices comprise a phase change memory device.

11. The method of claim 8, wherein the corresponding plurality of NVM devices comprise a resistive random access memory device.

12. The method of claim 8, wherein the corresponding plurality of NVM devices comprise a transistor and a resistor.

13. The method of claim 8, wherein the corresponding plurality of NVM devices comprise a selector and a resistor.

14. The method of claim 8, wherein the plurality of conductances comprise a plurality of weights associated with a plurality of inferences for a neural network.

15. A computer program product comprising one or more computer readable storage media, and program instructions collectively stored on the one or more computer readable storage media, the program instructions comprising instructions configured to cause one or more processors to perform a method comprising:
    setting a plurality of conductances for a corresponding plurality of non-volatile memory (NVM) devices of a cross-bar array to zero;
    determining a plurality of pulse-widths for the corresponding plurality of NVM devices based on a corresponding plurality of programming errors;
    programming the corresponding plurality of NVM devices using the determined plurality of pulse-widths, wherein an inference chip for a neural network comprises the corresponding plurality of NVM devices;
    measuring a plurality of actual conductances for the corresponding plurality of NVM devices;
    adjusting a plurality of scaling factors for the corresponding plurality of NVM devices based on the plurality of actual conductances and the corresponding plurality of programming errors; and
    programming the corresponding plurality of NVM devices based on the determined plurality of pulse-widths and the plurality of scaling factors.

16. The computer program product of claim 15, wherein the corresponding plurality of NVM devices comprise a phase change memory device.

17. The computer program product of claim 15, wherein the corresponding plurality of NVM devices comprise a resistive random access memory device.

18. The computer program product of claim 15, wherein the corresponding plurality of NVM devices comprise a transistor and a resistor.

19. The computer program product of claim 15, wherein the corresponding plurality of NVM devices comprise a selector and a resistor.

20. The computer program product of claim 15, wherein the plurality of conductances comprise a plurality of weights associated with a plurality of inferences for a neural network.

\* \* \* \* \*